(12) United States Patent
Takano et al.

(10) Patent No.: US 8,101,461 B2
(45) Date of Patent: Jan. 24, 2012

(54) STACKED SEMICONDUCTOR DEVICE AND METHOD OF MANUFACTURING THE SAME

(75) Inventors: Akihito Takano, Nagano (JP); Naohiro Mashino, Nagano (JP)

(73) Assignee: Shinko Electric Industries Co., Ltd., Nagano-shi, Nagano (JP)

( * ) Notice: Subject to any disclaimer, the term of this patent is extended or adjusted under 35 U.S.C. 154(b) by 58 days.

(21) Appl. No.: 12/638,358

(22) Filed: Dec. 15, 2009

(65) Prior Publication Data

US 2010/0148340 A1    Jun. 17, 2010

(30) Foreign Application Priority Data

Dec. 16, 2008   (JP) ................................ P2008-320008

(51) Int. Cl.
*H01L 21/82* (2006.01)
(52) U.S. Cl. ................. 438/109; 257/E21.449; 257/686
(58) Field of Classification Search ................. 257/686, 257/777, 778, E21.449
See application file for complete search history.

(56) References Cited

U.S. PATENT DOCUMENTS

| | | | |
|---|---|---|---|
| 6,628,527 B2 * | 9/2003 | Muramatsu et al. ........ | 361/768 |
| 7,768,795 B2 * | 8/2010 | Sakurai et al. ............. | 361/790 |
| 7,843,059 B2 * | 11/2010 | Gomyo et al. .............. | 257/723 |
| 2007/0284716 A1 * | 12/2007 | Vindasius et al. .......... | 257/686 |
| 2008/0094793 A1 * | 4/2008 | Sakurai et al. ............. | 361/684 |
| 2008/0111225 A1 * | 5/2008 | Kim et al. .................. | 257/686 |
| 2009/0020887 A1 * | 1/2009 | Mizuno et al. .............. | 257/777 |
| 2009/0020889 A1 * | 1/2009 | Murayama et al. ......... | 257/777 |
| 2009/0023247 A1 * | 1/2009 | Mizuno et al. .............. | 438/109 |
| 2009/0146283 A1 * | 6/2009 | Chen et al. ................. | 257/686 |
| 2009/0179318 A1 * | 7/2009 | Chen .......................... | 257/686 |
| 2009/0206464 A1 * | 8/2009 | Chung et al. ............... | 257/686 |
| 2009/0230533 A1 * | 9/2009 | Hoshino et al. ............ | 257/686 |

FOREIGN PATENT DOCUMENTS

| | | |
|---|---|---|
| JP | 2000-340694 | 12/2000 |
| JP | 3895768 | 12/2006 |

* cited by examiner

*Primary Examiner* — Nathan Ha
(74) *Attorney, Agent, or Firm* — Drinker Biddle & Reath LLP

(57) ABSTRACT

A method of manufacturing a semiconductor device includes: (a) half-dicing a semiconductor wafer including plural semiconductor chips, thereby forming dicing grooves in the semiconductor wafer, wherein each semiconductor chip includes a circuit and pads and wherein the semiconductor wafer includes: a first surface on which the circuit and the pads are formed; and a second surface opposite to the first surface, (b) connecting the pads to each other by conductive connectors; (c) sealing the first surface of the semiconductor wafer, the dicing grooves and the conductive connectors with a resin; (d) grinding the second surface of the semiconductor wafer, thereby forming a group of sealed chips; (e) dividing the group of sealed chips into individual sealed chips; (f) mounting and stacking the individual sealed chips on a wiring substrate having connection terminals thereon; and (g) electrically-connecting the conductive connectors and the connection terminals using a conductive member.

11 Claims, 17 Drawing Sheets

FIG. 22

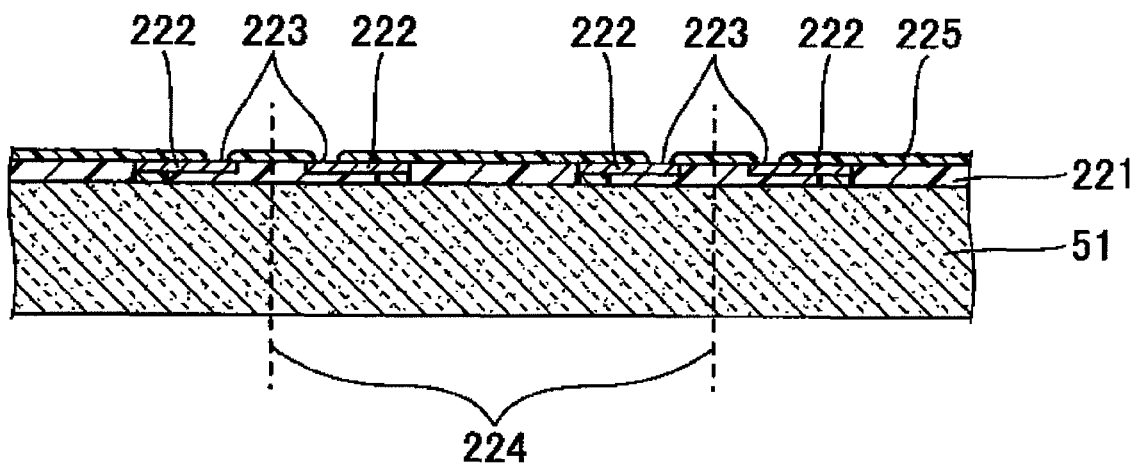

FIG. 23

FABRICATION METHOD OF SEMICONDUCTOR CHIP STACK
(THIRD EXEMPLARY EMBODIMENT)

```
(RE-WIRING OF SEMCIONDUCTOR WAFER)
a) FORM PLATED SEED LAYER
b) LAMINATE PHOTOSENSITIVE RESIST FILM
c) EXPOSURE-DEVELOPMENT
d) ELECTROLYTIC PLATING
e) REMOVE SEED LAYER
f) OVERCOATING
```

* FOLLOWINGS SUBSEQUENT TO STEP 1, HALF DICING,
ARE THE SAME AS THE PROCESS IN FIRST OR
SECOND EXEMPLARY EMBODIMENT.

STACKED SEMICONDUCTOR DEVICE AND METHOD OF MANUFACTURING THE SAME

BACKGROUND

1. Technical Field

The present disclosure relates to a semiconductor device and a method of manufacturing the same.

2. Related Art

In order to keep up with demands on portable information devices or small electronic appliances, such as high performance and miniaturization, high-density mounting technologies of semiconductor device are currently under research and development. Among these technologies, Wafer Level Packaging (WLP) technology, which fabricates packages while maintaining the size of semiconductor wafers, is regarded as having an important role. A new package is provided as a Chip Size Package (CSP), which is divided in a respective semiconductor chip package. The CSP, in the form of a single or additionally-coupled unit, is assembled to or mounted inside an application device. In response to recent advancements in content technologies and demands on the increasingly large capacity of memory, chip-mounting technologies in one field of the CSP have been widely used. The chip-mounting technologies are technologies for assembling semiconductor chips of known reliability on a new package by stacking the semiconductor chips one on another (see e.g., JP-A-2000-340694 and Japanese Patent No. 3895768).

JP-A-2000-340694 discloses chip-stacking technology and, more particularly, discloses one type of a semiconductor chip stack, which requires a complicated fabrication process when connecting from outside to the side surfaces of the semiconductor chips after the dicing of a wafer. For example, this is a complicated process using an anisotropic conductive film or a flexible circuit substrate or forming an insulating film and a conductive film after stacking multiple layers of semiconductor chips. In addition, Japanese Patent No. 3895768 discloses another type of a semiconductor chip stack as shown in FIG. 1, and requires a complicated process, which includes, for example, sputtering nitrides to insulate the side surfaces 12 of semiconductor chips 11 after dicing the semiconductor chips. As above, the fabrication process including the stacking of chips is complicated and has an adverse effect on the quality of products.

SUMMARY OF THE INVENTION

An illustrative aspect of the present invention is to simplify a process as well as to improve the quality of products.

According to one or more illustrative aspects of the present invention, there is provided a method of manufacturing a semiconductor device. The method comprises: (a) half-dicing a semiconductor wafer comprising a plurality of semiconductor chips, thereby forming dicing grooves in the semiconductor wafer, wherein each of the semiconductor chips includes a semiconductor integrated circuit and pads and wherein the semiconductor wafer includes: a first surface on which the semiconductor integrated circuit and the pads are formed; and a second surface opposite to the first surface, (b) connecting the pads to each other by conductive connectors; (c) sealing the first surface of the semiconductor wafer, the dicing grooves and the conductive connectors with a resin; (d) grinding the second surface of the semiconductor wafer, thereby forming a group of sealed chips, in which bodies of the semiconductor chips are separated from each other and are bonded by the resin; (e) dividing the group of sealed chips into individual sealed chips; (f) mounting and stacking the individual sealed chips on a wiring substrate having connection terminals thereon, thereby forming a semiconductor chip stack; and (g) electrically-connecting the conductive connectors and the connection terminals using a conductive member, wherein the conductive connectors are extended through side surfaces of each of the individual sealed chips.

According to one or more illustrative aspects of the present invention, the method further comprises: (h) sealing the chip stack with a resin such that the conductive member is covered with the resin, after step (g).

According to one or more illustrative aspects of the present invention, the method further comprises: (i) improving a conductivity of ends of the conductive connectors, before step (g).

According to one or more illustrative aspects of the present invention, step (i) comprises: exposing the ends of the conductive connectors from the semiconductor chip stack by plasma etching.

According to one or more illustrative aspects of the present invention, step (i) comprises: mounting solders on the ends of the conductive connectors.

According to one or more illustrative aspects of the present invention, step (c) comprises: coating a surface of the dicing grooves with the resin such that a space formed by the dicing grooves is not filled with the resin.

According to one or more illustrative aspects of the present invention, the conductive member is made of a conductive paste or a solder.

According to one or more illustrative aspects of the present invention, there is provided a semiconductor device. The semiconductor device comprises: a wiring substrate having connection terminals thereon; a semiconductor chip stack comprising a plurality of semiconductor chips which are stacked on top of each other, the semiconductor chip stack being mounted on the wiring substrate, wherein each of the semiconductor chips comprises: a semiconductor integrated circuit that is formed on a surface of the semiconductor chip; a pad that is formed on the surface of the semiconductor chip; a conductive connector connected to the pad; and a first sealing resin that seals the semiconductor integrated circuit, the pad and the conductive connector such that an end portion of the conductive connector is exposed from the first sealing resin, and a conductive member that electrically connects each of the end portions of the conductive connectors to the connection terminals; and a second sealing resin that seals the semiconductor chip stack, the conductive member and a surface of the wiring substrate.

According to one or more illustrative aspects of the present invention, the semiconductor chip stack is flip-chip mounted on the wiring substrate.

Other aspects and advantages of the invention will be apparent from the following description, the drawings and the claims.

BRIEF DESCRIPTION OF THE DRAWINGS

FIG. 22 is a diagram illustrating a state where a re-wiring layer is formed on a semiconductor wafer in a fabrication method of semiconductor chip stacks in accordance with a third exemplary embodiment of the invention.

FIG. 23 is a diagram illustrating a fabrication method of semiconductor chip stacks, which is characterized by forming a re-wiring layer on a semiconductor wafer in accordance with the third exemplary embodiment of the invention.

DETAILED DESCRIPTION OF EXEMPLARY EMBODIMENTS

Exemplary embodiments of the present invention will be now described hereinafter with reference to the accompanying drawings.

First Exemplary Embodiment

A first exemplary embodiment illustrates a fabrication method of semiconductor chip stacks.

Figure 1:
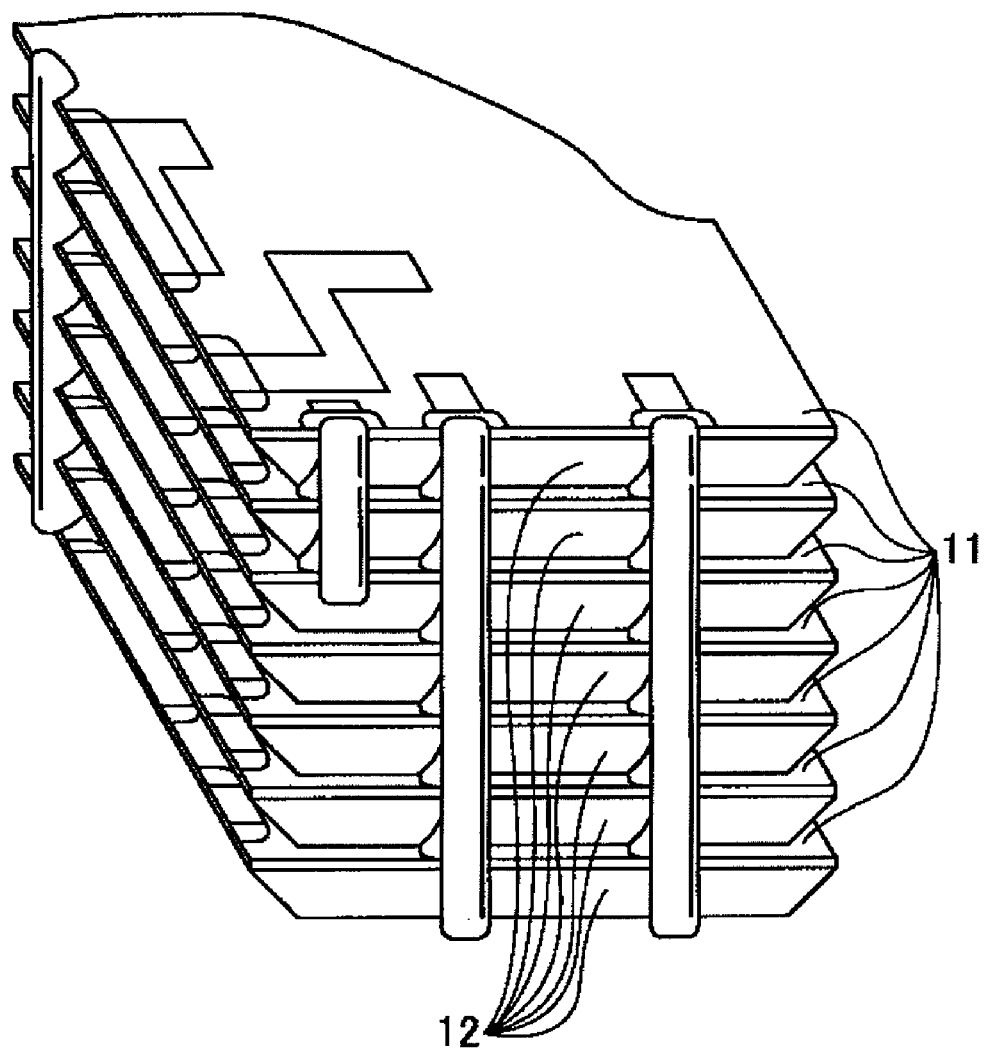
FIG. 1 is a diagram illustrating a related-art chip stack.
Figure 2:
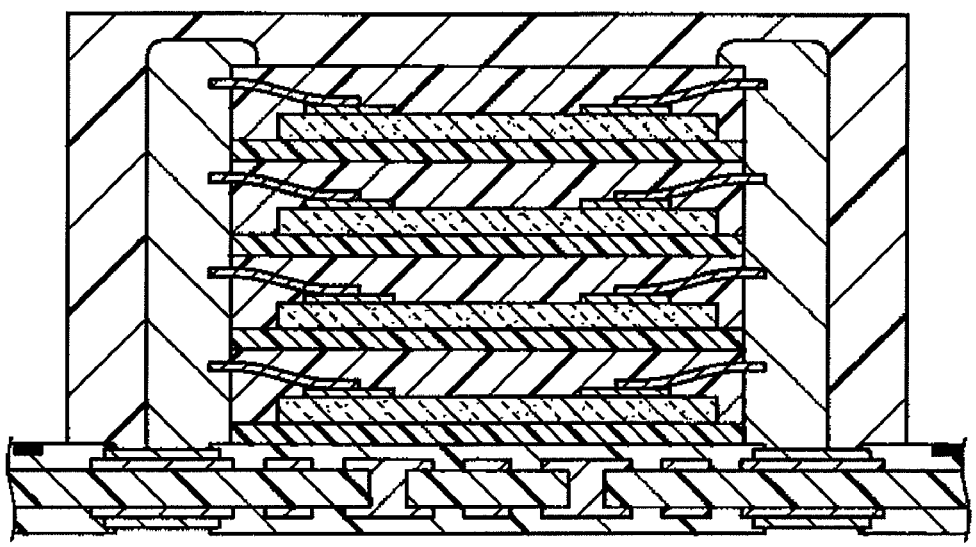
FIG. 2 is a diagram illustrating a semiconductor chip stack when a fabrication process in accordance with a first exemplary embodiment of the invention is completed.
Figure 3:
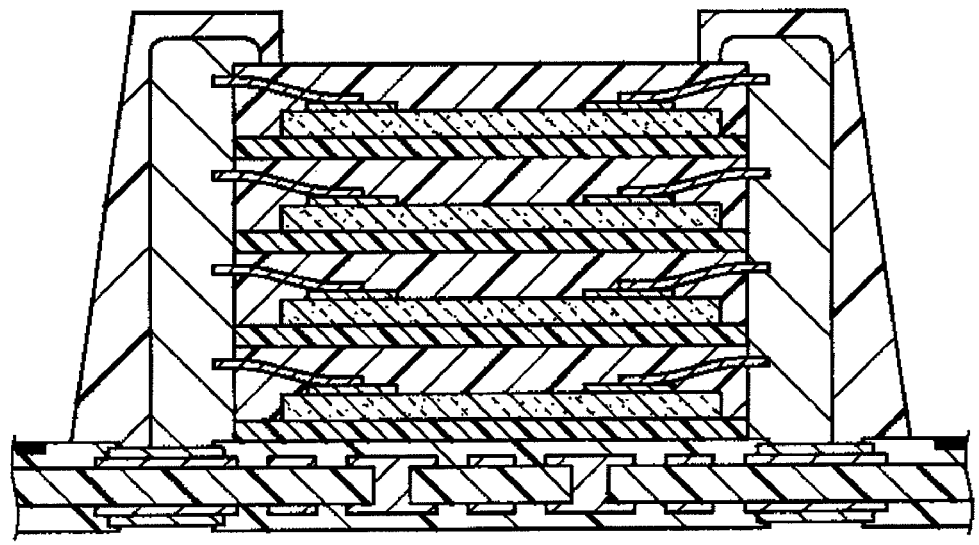
FIG. 3 is a diagram illustrating another semiconductor chip stack when the fabrication process in accordance with the first exemplary embodiment of the invention is completed.

FIGS. 2 and 3 illustrate semiconductor chip stacks when the fabrication method in accordance with the first exemplary embodiment of the invention is finished. FIG. 2 illustrates a semiconductor chip stack molded by resin-sealing by transfer molding, and FIG. 3 illustrates a semiconductor chip stack molded by resin-sealing by side-filling.

Figure 4:
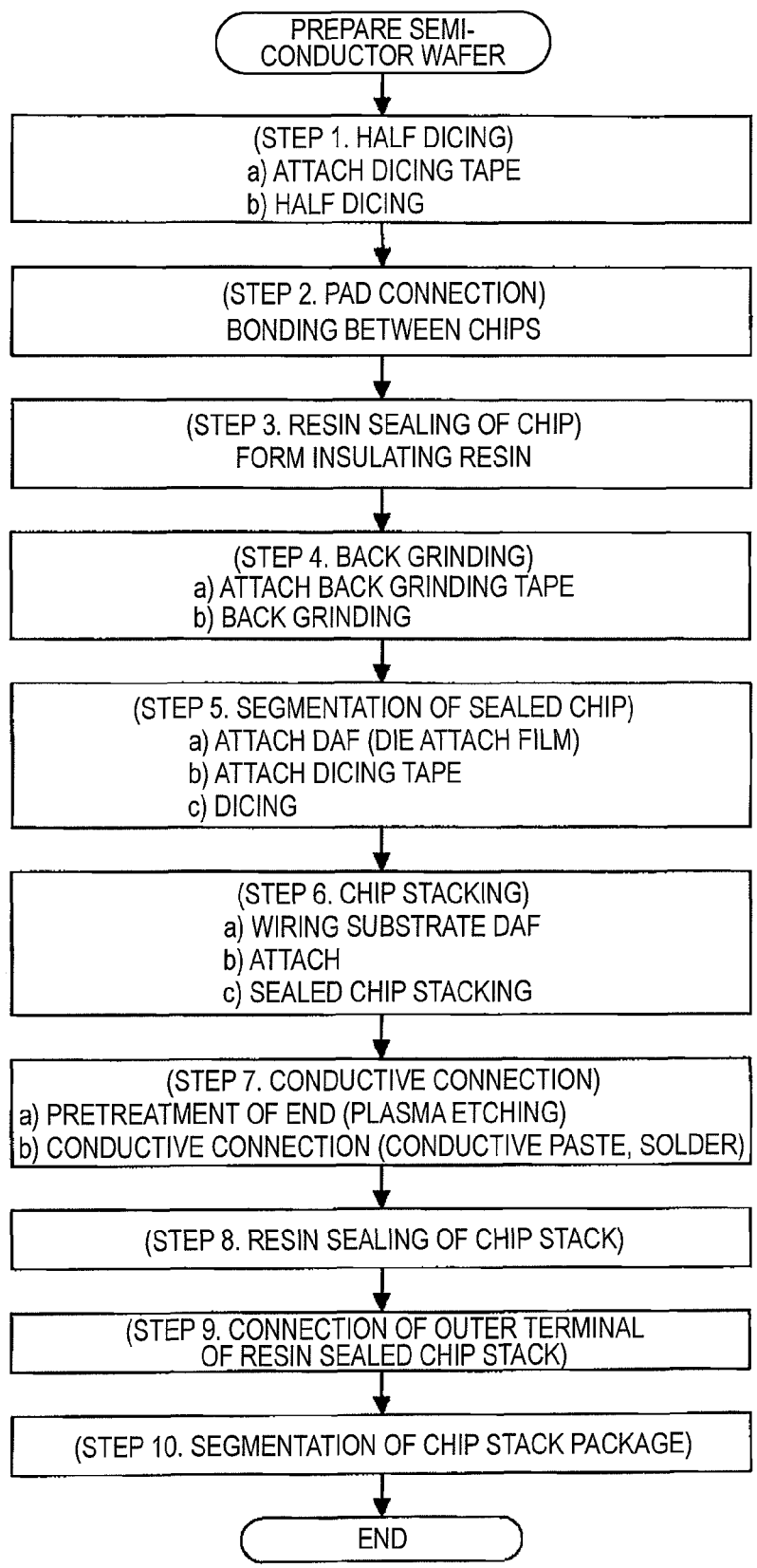
FIG. 4 is a diagram illustrating a fabrication method of semiconductor chip stacks in accordance with the first exemplary embodiment of the invention.

FIG. 4 is a diagram illustrating how a fabrication method of semiconductor chip stacks in accordance with the first exemplary embodiment is completed. The individual steps of FIG. 4 will be now described hereinafter with reference to FIGS. 5 to 16.

Figure 5:
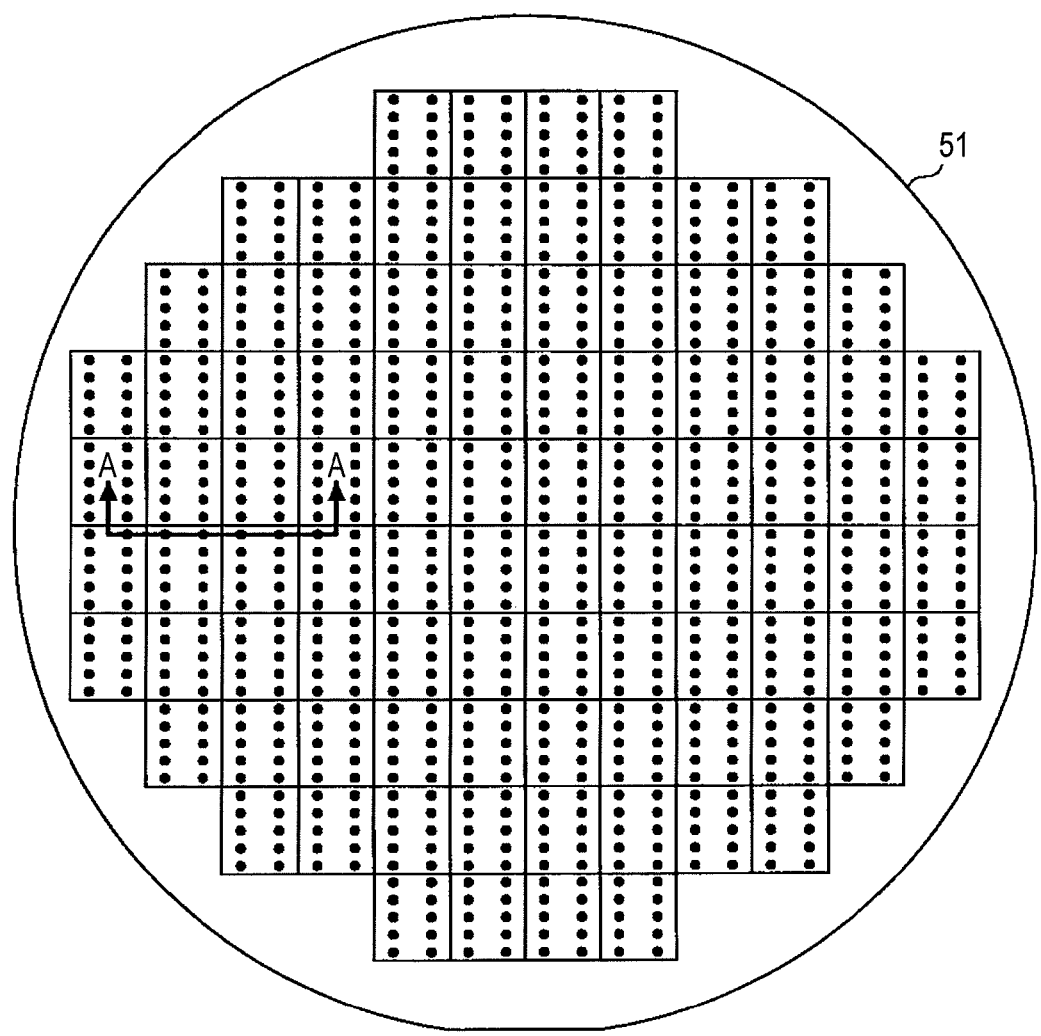
FIG. 5 is a diagram illustrating a semiconductor wafer to be prepared in the fabrication process in accordance with the first exemplary embodiment of the invention.

FIG. 5 is a diagram illustrating a semiconductor wafer to be prepared in the fabrication process in accordance with the first exemplary embodiment. Semiconductor chips for a chip stack are formed on the semiconductor wafer 51.

The diameter of the semiconductor wafer may be about 6, 8, or 12 inches. Referring to the size of the semiconductor chips to be stacked one on another, they have a square or rectangular shape, whose side length may be about 2 mm to about 15 mm. Before the semiconductor chips are stacked, the thickness of the semiconductor chips may be about 20 µm to about 50 µm.

[Step 1: Half Dicing]

Figure 6:
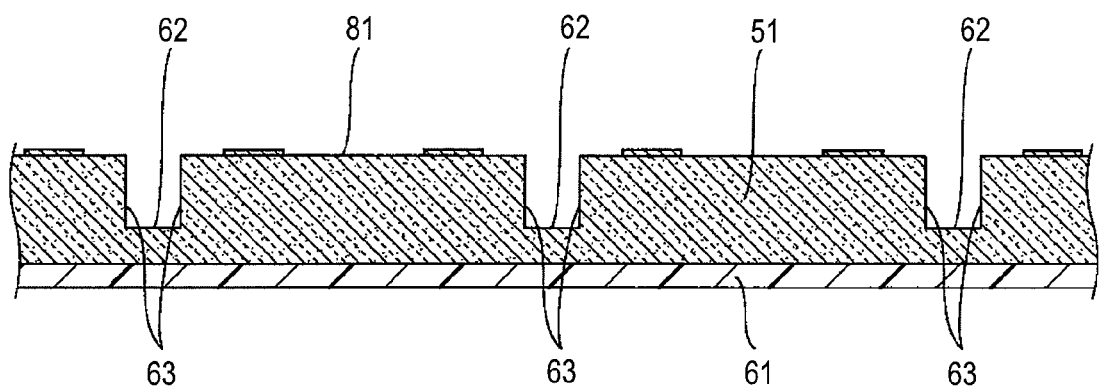
FIG. 6 is a diagram illustrating the cross section of a semiconductor wafer after completion of a half-dicing process in the fabrication process in accordance with the first exemplary embodiment of the invention.

FIG. 6 illustrates the cross section of the semiconductor wafer after completion of a half-dicing process. Such a cross-sectional view is taken along line A-A in FIG. 5. It should be understood that the following cross-sectional views also show the cross sections taken along the same line A-A, respectively. Half-dicing is performed by fixing the semiconductor wafer 51 to a dicer (not shown) by attaching a dicing tape 61 to the rear surface of the semiconductor wafer 51.

The half-dicing is a technique used in dividing thin semiconductor chips, i.e., separating the thin semiconductor chips from a semiconductor wafer as individual single bodies. Half-dicing is a technique that primarily forms side surfaces 63 of the semiconductor chips by dicing the semiconductor wafer up to the middle of thickness 62, and then, separates the individual semiconductor chips from the semiconductor wafer by back-grinding (rear side grinding) the semiconductor wafer. Conventionally, in the case of dividing semiconductor chips, if a wafer is punched and cut by a dicer, defects such as chipping and breaks would occur due to impacts during the cutting. In contrast, in the case of dividing thin semiconductor chips, whose thickness is in a range of about 20 to 50 μm, from a semiconductor wafer, the semiconductor wafer is half-diced by dicing up to the middle of thickness, and then, is back-ground. This, as a result, allows to effectively divide the semiconductor chips without impacts in the cutting or defects such as chipping. The depth of grooves formed by the half-dicing is a value obtained by adding, for example, about 10 μm to about 50 μm to the thickness of the final semiconductor chip, and the width of the grooves may be in a range of about 40 μm to about 80 μm.

[Step 2: Pad Connection]

Figure 7:
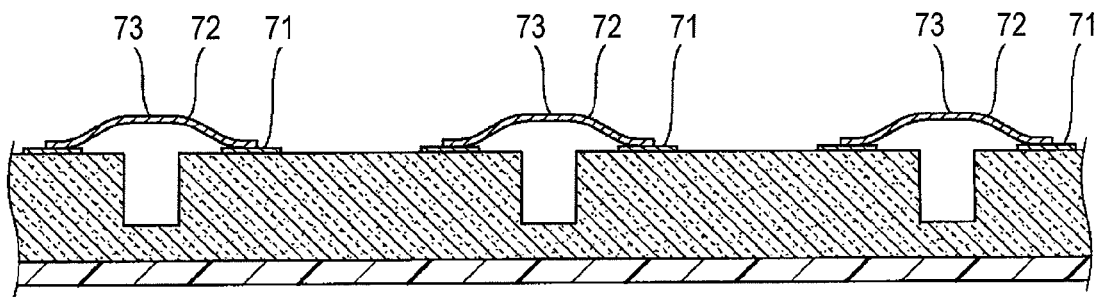
FIG. 7 is a diagram illustrating connection of pads in the fabrication process in accordance with the first exemplary embodiment of the invention.

FIG. 7 is a diagram illustrating connection of pads. The pads 71 on the semiconductor wafer are connected to each other by conductive connectors 72, respectively, using a bonding device (not shown). In FIG. 6 showing the half-dicing process of Step 1, the dicing grooves are formed, each of which has the side surfaces 63 and the middle of thickness 62. The conductive connectors 72 are provided to extend over the dicing grooves, thereby connecting the pads to each other. This is because the conductive connectors 72 are required to have a configuration extending over the dicing grooves in order to stack sealed chips and conductively connect ends of conductive connectors 72, exposed through the surface of an sealing resin. Such a conductive connection will be described in "Step 5, Division of Sealed Chip", and "Step 7, Conductive Connection". The conductive connectors 72 may be implemented with bonding wires or bonding ribbons, which are made of, for example, Au, Al, Cu, W, or an alloy thereof. The conductive connectors 72 serve to connect the pads 71 while drawing properly-bent curves when viewed from the side. In a subsequent step, the conductive connectors 72 are cut in the vicinity of peak positions 73 of the bent curves of the conductive connectors 72, thereby forming ends of the conductive connectors 72, which are to be exposed through the side of divided sealed chips in "Step 7, Conductive Connection".

[Step 3: Resin Sealing of Chips]

Figure 8:
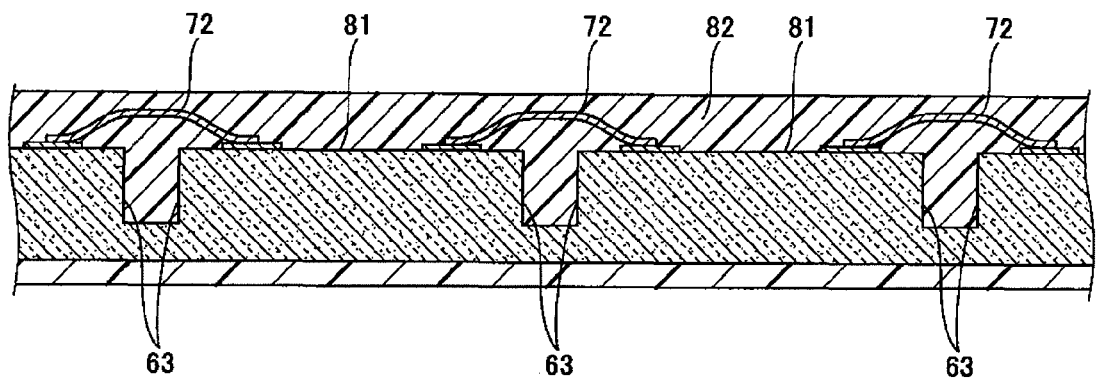
FIG. 8 is a diagram illustrating a state where a process of sealing chips in a resin is completed in the fabrication process in accordance with the first exemplary embodiment of the invention.

FIG. 8 is a diagram illustrating a state where a process of sealing chips with a resin is completed. In order to ensure insulation between the chips and fix the conductive connectors 72 in a given position, surfaces 81, the side surfaces 63, and the conductive connectors 72 are sealed with a resin 82. Resin sealing is performed on the entire surface of the semiconductor wafer on which the semiconductor chips are formed. In particular, it is important to seal the side surfaces 63 of the individual semiconductor chips with a resin in order to ensure insulation in connecting conductive members (see "Step 7, Conductive Connection"). In addition, since the conductive connectors 72 should be fixed in a given position by the resin sealing while maintaining the properly-bent state without deformation when viewed from the side, the resin 82 is required to have the properties of keeping a softened state in the early stage of the sealing process and then curing while maintaining the bent state of the conductive connectors 72. The sealing resin may be made of a film type resin, a tablet type resin, or a liquid resin. The film type resin can be implemented with an epoxy resin including silica or alumina as a filler, and is softened when heated in the early stage and then cures while maintaining the bent state of the conductive connectors 72. The semiconductor wafer can be sealed by transfer molding using a tablet type epoxy resin including a type of filler such as silica. In this case, a molding device is set to predetermined conditions, for example, a pressure from about 5 MPa to about 15 MPa and a temperature from about 170° C. to about 190° C. The following resin curing requires a temperature from about 160° C. to about 200° C. and a time period from about 4 hours to about 5 hours. In addition, the chip resin molding can be performed using a polyimide resin as the liquid resin.

[Step 4: Back Grinding]

Figure 9:
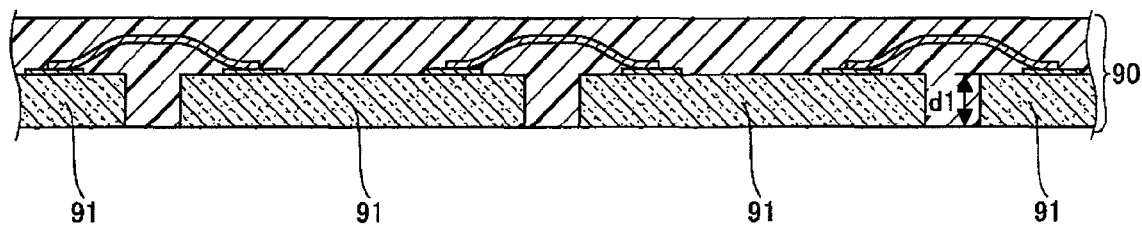
FIG. 9 is a diagram illustrating a state where a back-grinding process is completed in the fabrication process in accordance with the first exemplary embodiment of the invention.

FIG. 9 is a diagram illustrating a state where a back grinding process is completed in the fabrication process. By back-grinding the half-diced semiconductor wafer using a surface grinder (not shown), the semiconductor chips can be divided into individual chips, each of which has an intended thickness dl of the thin semiconductor chips. In this case, the silicon bodies of the semiconductor chips 91 are separated from each other. In "Step 3, Resin Sealing of Chips", a resin is formed on the semiconductor IC surfaces of the semiconductor wafer, and the bodies of the semiconductor chips 91 are integrated by the resin, thereby forming a group of sealed chips. Since the semiconductor chips 91 can be treated as one wafer state in the process, productivity can be ensured.

[Step 5: Division of Sealed Chip]

Figure 10:
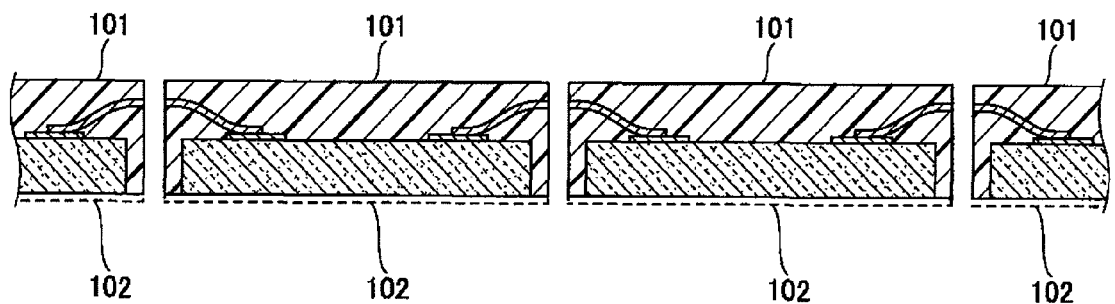
FIG. 10 is a diagram illustrating a state where sealed chips have been divided in the fabrication process in accordance with the first exemplary embodiment of the invention.

FIG. 10 is a diagram illustrating a state where sealed chips are completely divided. From the state 90 where the semiconductor chips shown in FIG. 9 are integrated together by the resin sealing, sealed chips 101 are divided using a dicer (not shown), so that the sealed chips 101 can be used for chip stacks. In addition, before using the dicer, the semiconductor chips integrated together by the resin sealing are fixed to a frame for the dicer by attaching a dicing tape 102 to the rear surface of the semiconductor chips.

In addition, before attaching the dicing tape 102 to the rear surface of the semiconductor chips, a bonding resin used in a subsequent step of chip-to-chip bonding can be attached to or applied on the rear surface of the resin-sealed semiconductor chips. Then, a process of providing a bonding resin on each of the chips can be omitted in "Step 6, Chip Stacking", so that the process can be simplified.

In addition, the bonding resin can be implemented with, for example, a Die Attach Film (DAF). The DAF can also have a function of protecting the rear surface of the semiconductor chips as an insulating member in addition to a bonding function. Accordingly, the use of the DAF can contribute to the improvement of the product quality. The thickness of the DAF may be in a range of about 10 μm to about 100 μm, which can be selected depending on the thickness of the semiconductor chips, the type of a sealing resin, or dicing conditions.

[Step 6: Chip Stacking]

Figure 11:
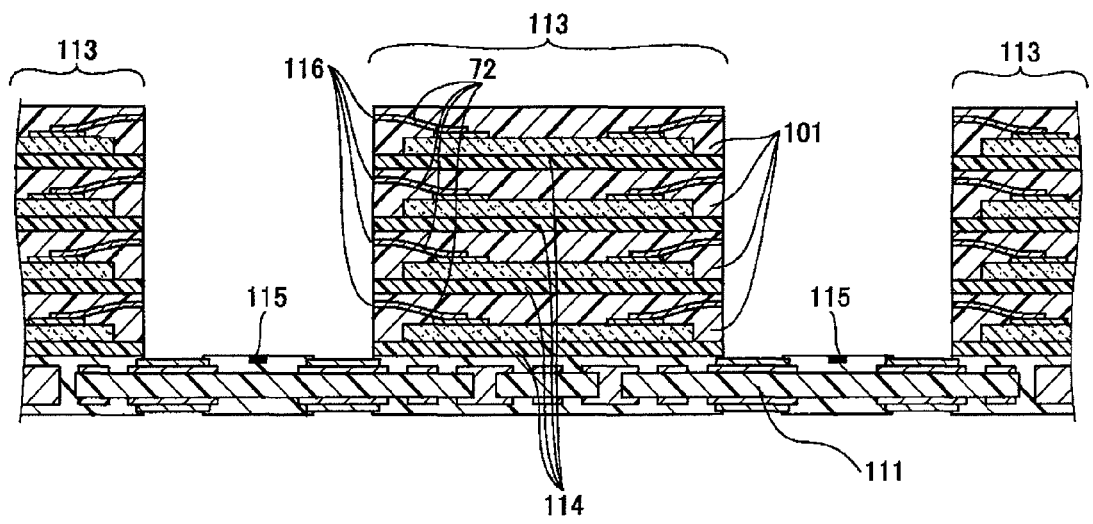
FIG. 11 is a diagram illustrating a state where stacking of chips is completed in the fabrication process in accordance with the first exemplary embodiment of the invention.

FIG. 11 is a diagram illustrating a state where the chips are completely stacked. Respective chip stacks 113 are formed by mounting and stacking the sealed chips 101, which are divided in the "Step 5, Division of Sealed Chip", on a wiring substrate 111. In order to mount plural chip stacks 113 on the common wiring substrate 111, the area of the wiring substrate 111 corresponds to the total number of the chip stacks 113. The wiring substrate 111 typically has a length of about 30 cm to about 80 cm. In addition, a bonding resin 114 is attached to the rear surface of the sealed chips 101. In order to simplify the process, the bonding resin 114 can be previously attached to the rear surface of the sealed chips 101 in "Step 5, Division of Sealed Chip". The sealed chips 101 are stacked by aligning the edges of the respective sealed chips 101 on the basis of alignment marks 115 which are provided on the top surface of the wiring substrate 111. Then, the bonding resin 114 interposed between the respective sealed chips 101 is thermally cured.

Here, the technical term "mounting and stacking" indicates a mounting method of sequentially stacking plural sealed chips on the wiring substrate or mounting sealed chips, which are in a stacked and integrated state, on the wiring substrate, and fixing the position of the sealed chips while electrically connecting the sealed chips to the wiring substrate.

In addition, the upward and downward directions of the semiconductor IC surfaces of the individual sealed chip can be set to one direction according to design conditions of the chip stack. However, in the case of varying the directions of the sealed chips, it is necessary to form an individual bonding resin when stacking the respective semiconductor chips.

[Step 7: Conductive Connection]

Figure 12:
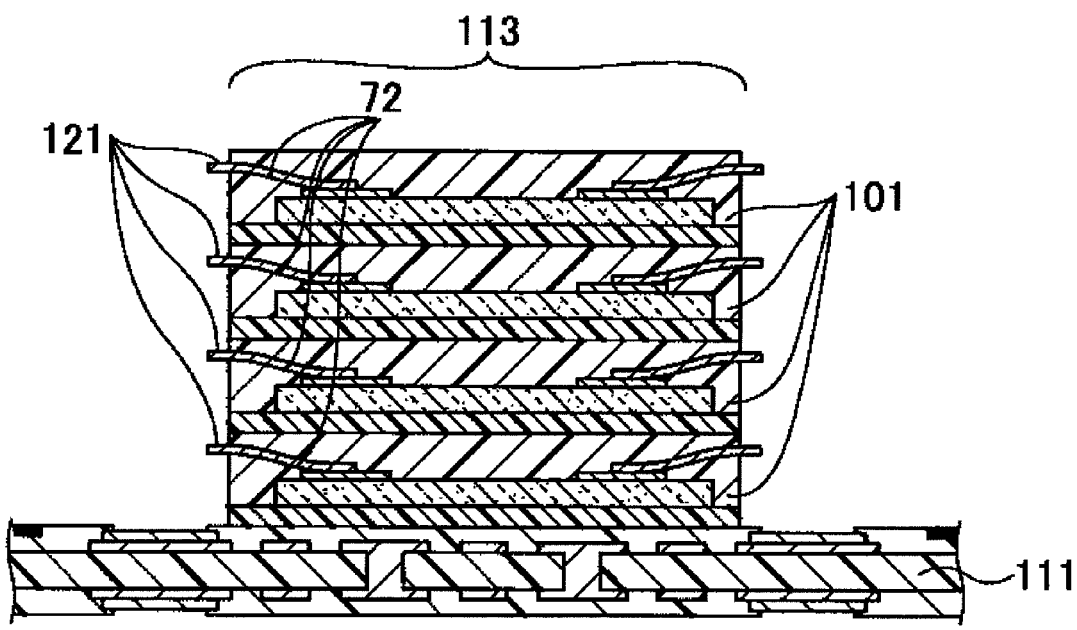
FIG. 12 is a diagram illustrating a state where ends 121 of conductive connectors 72 are exposed in the fabrication process in accordance with the first exemplary embodiment of the invention.
Figure 13:
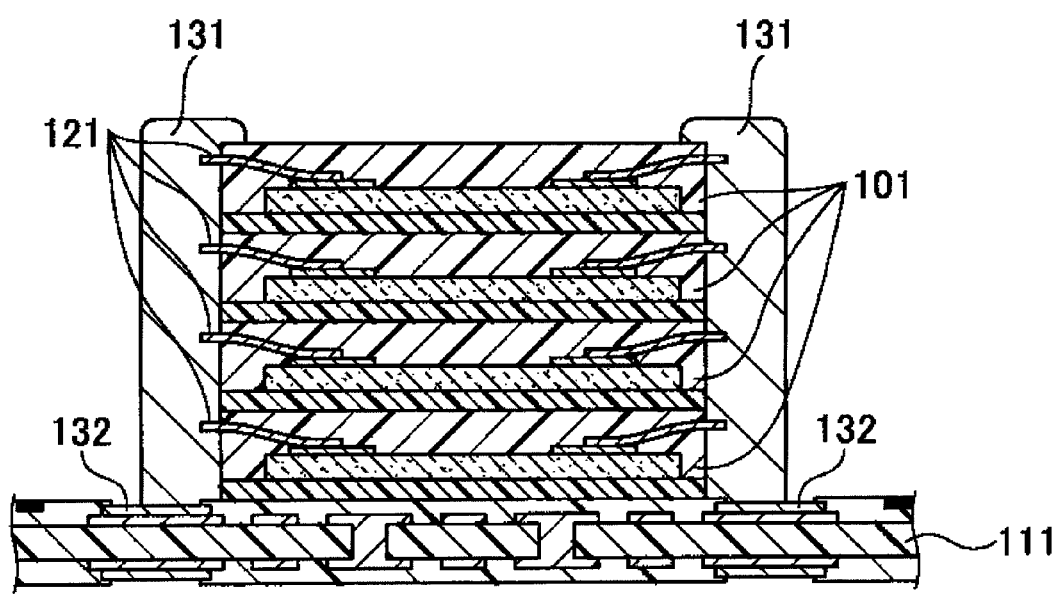
FIG. 13 is a diagram illustrating a state where conductive connection is completed in the fabrication process in accordance with the first exemplary embodiment of the invention.

FIG. 13 is a diagram illustrating a state where conductive connection is completed. Ends 121 of the conductive connectors 72, which are exposed from sides of the sealed chips 101, are connected to each other by conductive members 131 in order to electrically connect the sealed chips 101 to each other or to the wiring substrate 111. In completion of "Step 6, Chip Stacking" as shown in FIG. 11, only end surfaces 116 covering the ends 121 of the conductive connectors 72 are exposed. However, high-precision conductive connection can be realized by performing a treatment to improve the conductivity of the ends 121. That is, it is possible to expose the ends 121 of the conductive connectors 72, as shown in FIG. 12, by removing the sealing resin covering the ends 121 adjacent to the end surfaces 116 of the conductive connectors 72 by plasma etching. Thus, a sufficient area to be connected with the conductive members 131 can be ensured. At the same time, the conductive members 131 shown in FIG. 13 are electrically connected to conductive terminals 132 which are arranged on the wiring substrate 111. The conductive members 131 may be made of a conductive paste or a solder. The conductive paste may be implemented with an epoxy resin containing a filler of Ag.

Such a plasma etching has a function of removing the sealing resin and a function of cleaning the ends 121 by removing contamination, for example, a resin adhering to the conductive connectors 72. Precision in the electrical connection between the conductive connectors 72 and the conductive members 131 can be improved by cleaning the ends 121 of the conductive connectors 72. The plasma etching can use a gas such as $O_3$, $O_2$, F, or Ar gas.

In addition, in "Step 7, Conductive Connection", infiltration or scattering may occur in the conductive members 131. If a portion of the conductive members 131 is attached to a portion of the sealed chips 101 except for the ends 121 of the conductive connectors 72, electrical characteristics may be degraded due to, for example, defective insulation in the semiconductor chip. Accordingly, it is especially important to insulate the side surface of the sealed chip 101 using a sealing resin before the conductive connection is carried out.

[Step 8: Resin Sealing of Chip Stack]

Figure 14A:
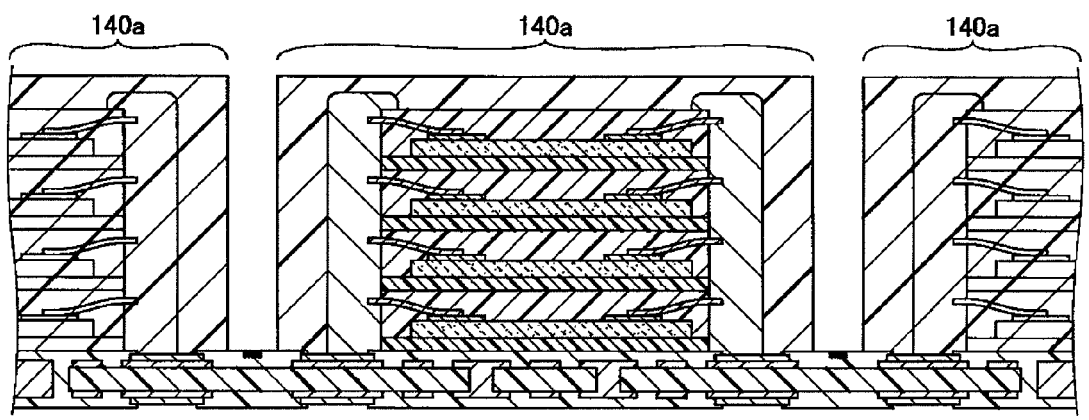
FIG. 14A is a diagram illustrating a state where sealing of chip stacks with a transfer molding resin is completed in the fabrication process in accordance with the first exemplary embodiment of the invention.
Figure 14B:
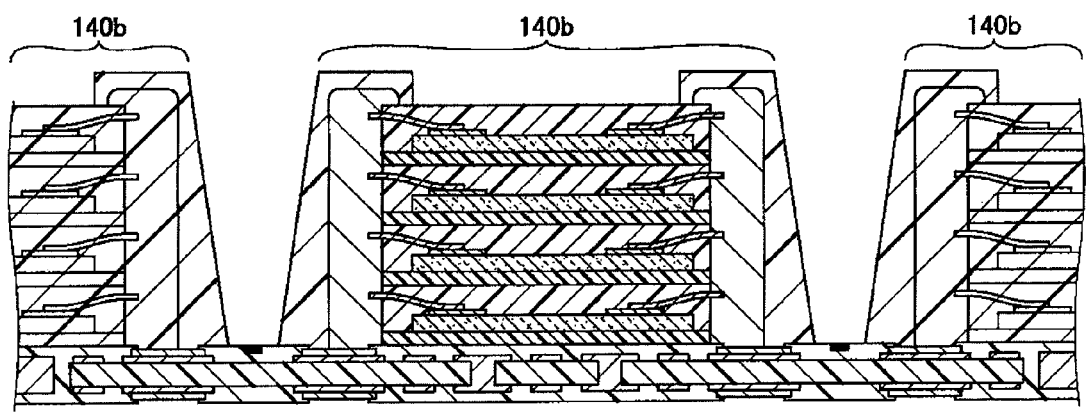
FIG. 14B is a diagram illustrating a state where side-filling resin sealing of chip stacks is completed in the fabrication process in accordance with the first exemplary embodiment of the invention.

FIGS. 14A and 14B are diagrams illustrating a state where chip stacks are sealed with a resin. FIG. 14A shows three chip stacks 140a, which are transfer molded, and FIG. 14B shows three chip stacks 140b, which are side-filling sealed with a potting resin. Any type of resin sealing can be performed the same as transfer molding or potting-resin sealing of semiconductor chips. In addition, products as shown in FIGS. 2 and 3 can be formed by separating the semiconductor chip stacks 140a, each of which is mounted on the wiring substrate 111, using a shearing device.

[Step 9: Connection of Outer Terminal]

Figure 15:
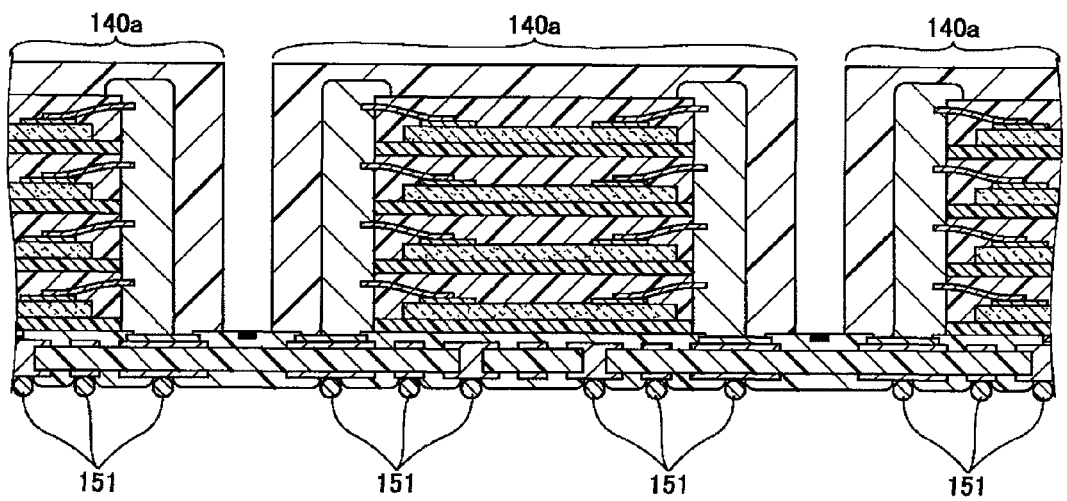
FIG. 15 is a diagram illustrating a state where external connection terminals 151 are connected to chip stacks 140a after the chip stacks 140a are sealed with a transfer molding resin in the fabrication process in accordance with the first exemplary embodiment of the invention.

FIG. 15 is a diagram illustrating a state where external connection terminals 151 are connected to the chip stacks 140a after resin sealing by transfer molding is performed. In the case of resin sealing by side-filling, the external connection terminals 151 can be connected in the same manner. The external connection terminals may be solder balls. The solder balls are Sn—Ag solder balls or balls formed by providing solder on the surface layer of a Cu core. The connection of the external terminals is completed by mounting of solder balls, reflow or the like.

[Step 10: Dividing Chip Stack Package]

Figure 16:
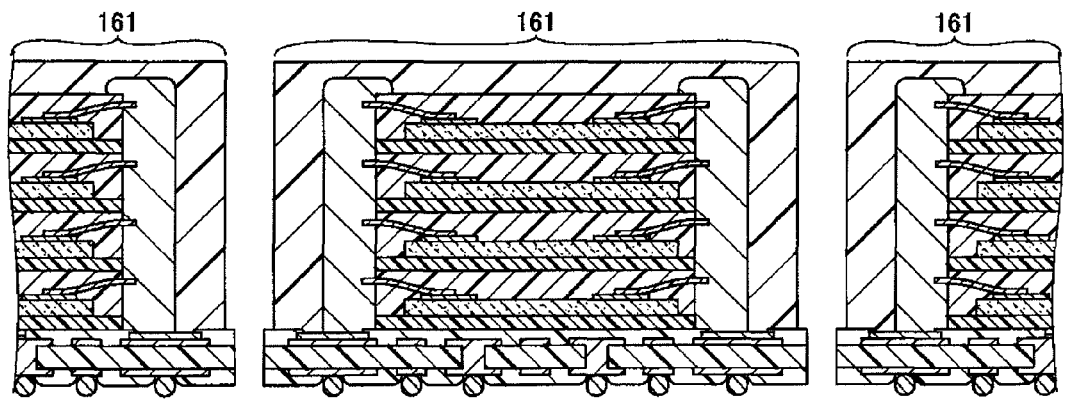
FIG. 16 is a diagram illustrating chip stack packages 161, which are divided by, for example, a shearing device in the fabrication process in accordance with the first exemplary embodiment of the invention.

FIG. 16 is a diagram illustrating chip stack packages 161, which are divided by, for example, a shearing device. Referring to the size of the packages, they have a square or rectangular shape whose side length is in a range of about 10 mm to about 50 mm. As such, the process of the chip stack packages is completed.

Advantages of First Exemplary Embodiment

In the respective semiconductor chips of the chip stacks, insulation property can be ensured on the side surfaces using the sealing resin, thereby making it possible to avoid defective insulation property of the semiconductor chips in the conductive connecting step as well as to ensure electrical characteristics of the chip stacks. In addition, when the half-diced semiconductor chips are resin-sealed, it is possible to separate the thin semiconductor chips whose thickness is in a range of about 20 μm to about 50 μm without causing defects. Thus, it is possible to simplify the fabrication process of the chip stacks while improving the quality of products.

Modified Example of First Exemplary Embodiment

Figure 17A:
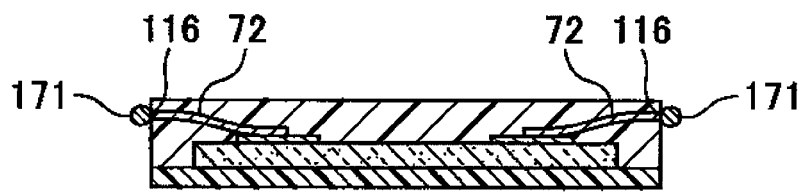
FIG. 17A is a diagram illustrating a state where solder 171 is attached to ends 116 of conductive connectors 72 of a divided sealed chip 101 in accordance with a modified example of the first exemplary embodiment of the invention.
Figure 17B:
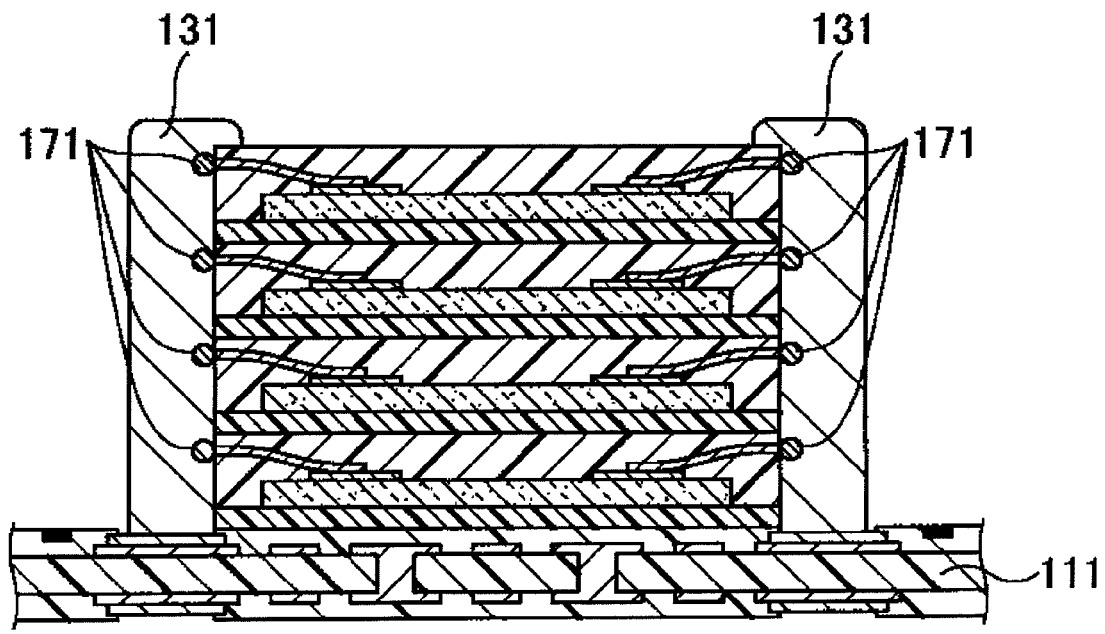
FIG. 17B is a diagram illustrating a state where a sufficient area for connecting ends of conductive connectors 72 to conductive members 131 is ensured in accordance with a modified example of the first exemplary embodiment of the invention.

A modified example of the first exemplary embodiment is related to a method of exposing other conductive connectors in "Step 7, Conductive Connection". In the first exemplary embodiment, as shown in FIG. 12, the sealing resin is removed by performing plasma etching. Thus, the ends 121 of the conductive connectors 72 are exposed and the cleaning effects can be obtained. However, in the modified example, as shown in FIG. 17A, a solder 171 are attached to the end surfaces 116. The end surfaces 116 of the conductive connectors 72 are dipped in a solder solution or a solder is blown so that the solder 171 can be attached to the divided sealed chips 101. With this solder-dip method or the like, the connection area of the ends to be electrically connected is increased and a sufficient connection area with the conductive members 131 can be ensured as shown in FIG. 17B. The other steps of semiconductor chip stacks are the same as those in the first exemplary embodiment.

Advantages of Modified Example of First Exemplary Embodiment

As the solder 171 is attached by, for example, the solder-dip method, the connection area of the ends of the conductive connectors to be electrically connected can be increased without removing the sealing resin. Thus, it is possible to improve the precision of electrical connection to the conductive members.

Second Exemplary Embodiment

A second exemplary embodiment of the invention illustrates a fabrication method of semiconductor chip stacks, which is characterized in resin coating. In the first exemplary embodiment, in the case of dividing the sealed chips, it is required to cut the resin, which is injected into the dicing grooves, after the half-dicing. Accordingly, the same chip is cut twice by a dicing blade. The second exemplary embodiment can perform chip separation by maintaining the shape of the dicing grooves due to resin coating. This can accomplish simplification in the process by making it unnecessary to cut the resin inside the grooves.

Figure 18:
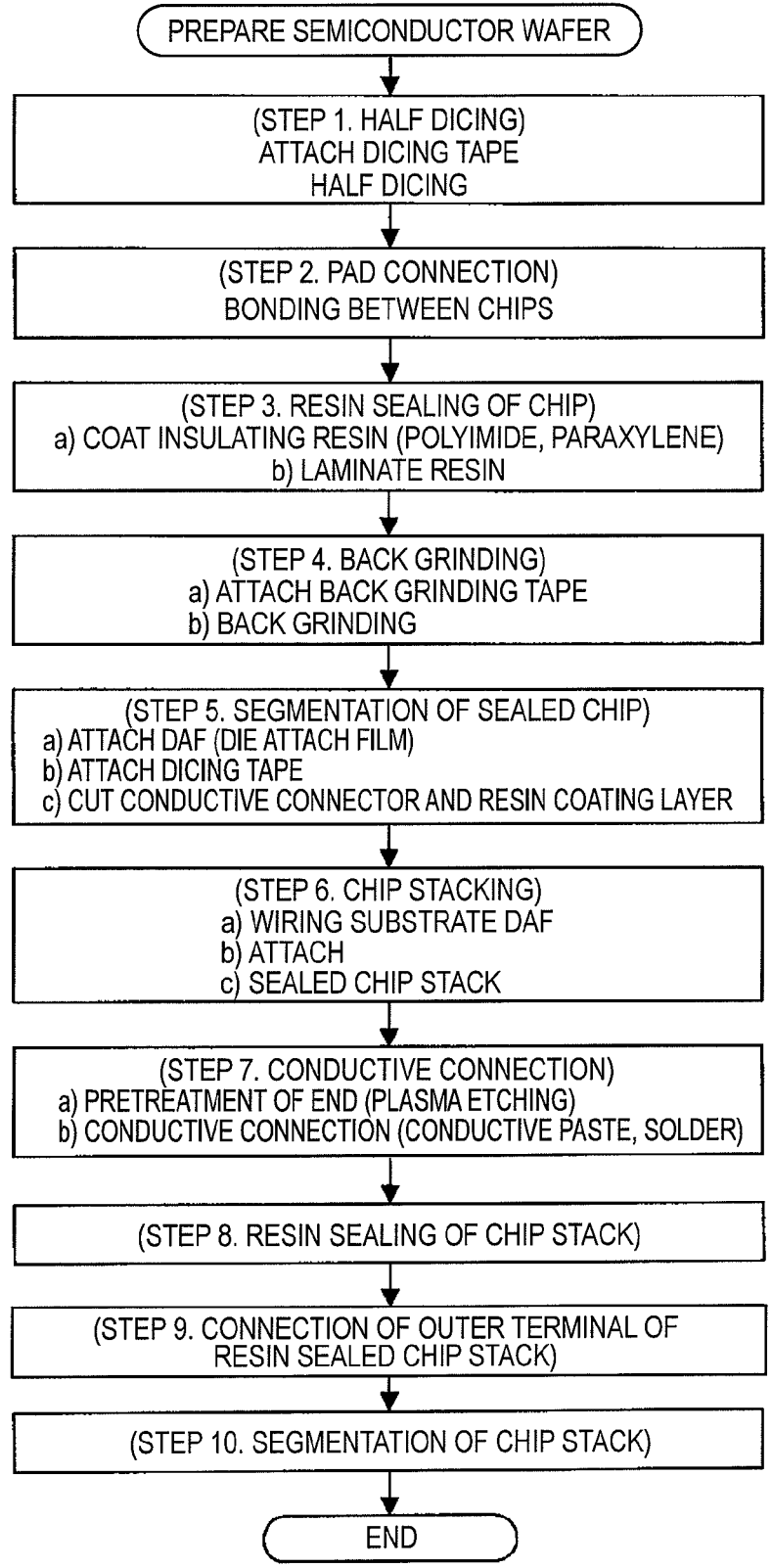
FIG. 18 is a diagram illustrating a fabrication method of semiconductor chip stacks in accordance with a second exemplary embodiment of the invention.

FIG. 18 is a diagram illustrating a fabrication method of semiconductor chip stacks in accordance with the second exemplary embodiment of the invention. The individual steps of the fabrication method will be now described with reference to FIGS. 19 to 21. A description will be given of Steps 3 to 5. The respective Step 3 to 5 are different from the respective Steps described in the above-described fabrication method of the first exemplary embodiment shown in FIG. 4, and the description of the other common parts, which are already described in the first exemplary embodiment, will be omitted herein.

[Step 3: Resin Sealing of Chips]

Figure 19:
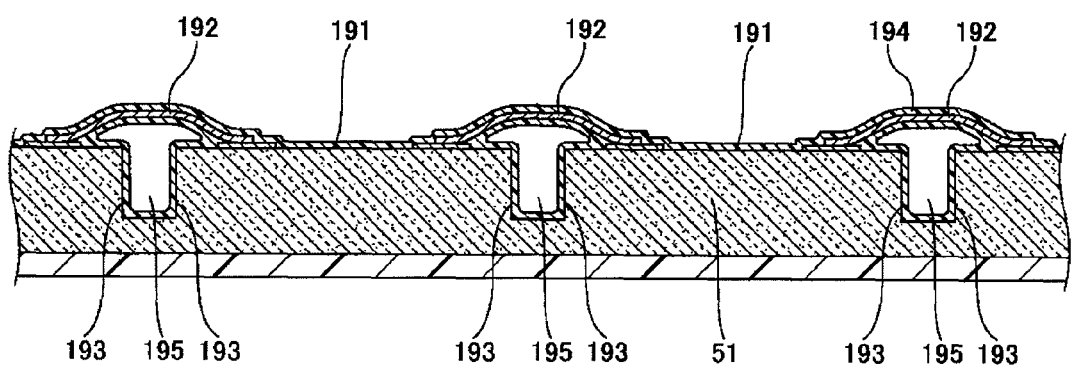
FIG. 19 is a diagram illustrating a state where coating of an insulating resin is completed in "a) Step 3, Resin Sealing of Chips", shown in FIG. 18, in accordance with the second exemplary embodiment of the invention.

FIG. 19 is a diagram illustrating a state where "a) coating of an insulating resin" is completed in "Step 3, Resin Sealing of Chips", as shown in FIG. 18. Semiconductor IC surfaces 191, side surfaces 193, and conductive connectors 192 of semiconductor chips 51 are sealed with a resin 194. Resin coating is performed to maintain the shape of dicing grooves 195 formed by the half-dicing. The resin may be made of polyimide or paraxylene. Polyimide may be formed by coating and curing, and paraxylene is formed by Chemical Vapor Deposition (CVD). In the case of using a liquid polyimide resin, a film whose thickness is in a range of about 5 μm to about 10 μm is formed on, for example, the conductive connectors 192 and the side surfaces 193 of the semiconductor chips 51 according to spin coating or spray coating or the like. Curing conditions may include a temperature of about 200° C. to about 300° C. and a time period of about 0.5 hour to about 1 hour.

Figure 20A:
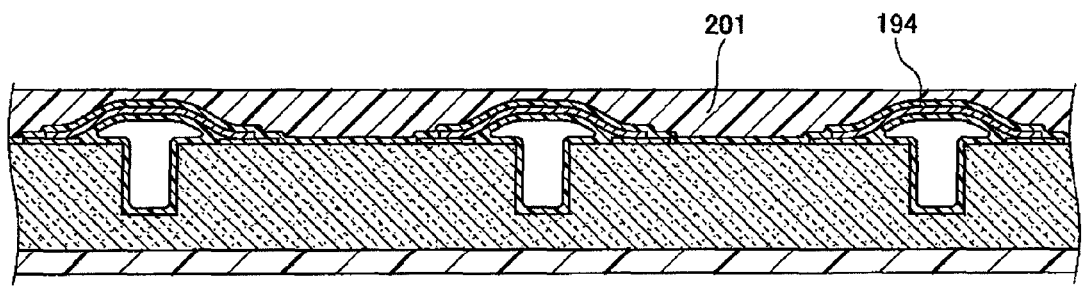
FIG. 20A is a diagram illustrating a state where resin lamination is completed in "b) Step 3, Resin Sealing of Chips", shown in FIG. 18, in accordance with the second exemplary embodiment of the invention.

FIG. 20A is a diagram illustrating a state where "b) a resin lamination" is completed in "Step 3, Resin Sealing of Chips", as shown in FIG. 18. A film type thermoplastic resin 201 is closely adhered along the outline of the resin 194, obtained by "a) the coating of an insulating resin", and then is cured, thereby completing the resin lamination.

[Step 4: Back Grinding]

Figure 20B:
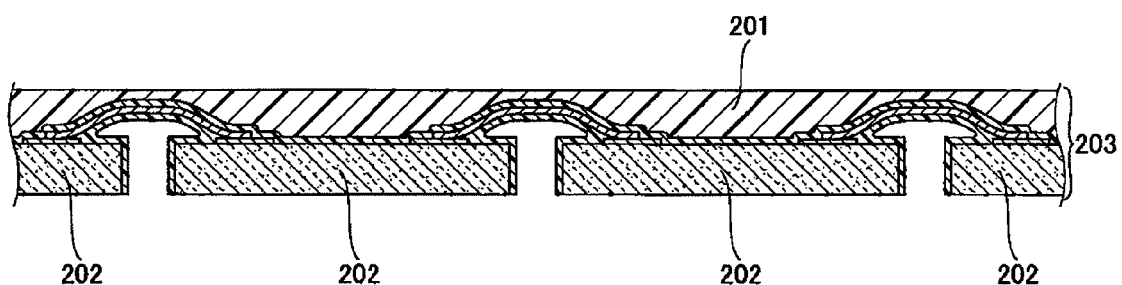
FIG. 20B is a diagram illustrating a state where a back-grinding process is completed in the fabrication process in accordance with the second exemplary embodiment of the invention.

The semiconductor chips 202 are divided into individual chips through back-grinding as shown in FIG. 20B. However, the semiconductor chips 202 are still integrated together by the film type resin 201. Accordingly, the semiconductor chips 202 can be treated as a single-piece construction 203, which is shaped like a wafer and is composed of a group of sealed chips.

[Step 5: Division of Sealed Chip]

Figure 21:
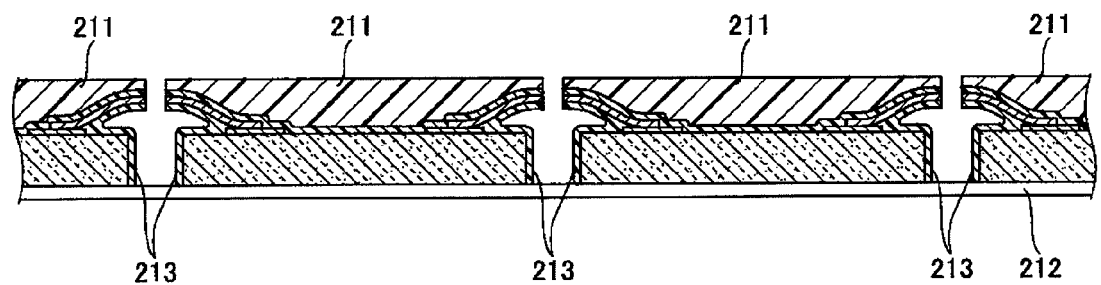
FIG. 21 is a diagram illustrating a state where sealed chips have been divided in the fabrication process in accordance with the second exemplary embodiment of the invention.

FIG. 21 is a diagram illustrating a state where sealed chips are completely divided. The sealed chips 211 for chip stacking are obtained by dividing the single-piece construction 203 using a dicer (not shown). A tape 212 is used for a frame of the dicer.

Advantages of Second Exemplary Embodiment

Since the grooves are already formed in the side surface 213 of the sealed chip before the sealed chip is divided, it is not required to dice the side surface 213, thereby accomplishing process simplification. In addition, the dicer can be used without applying vibration or impact to a sealing material adjacent to the side surface 213 of the chip. In this case, the members to be cut can remain in the minimum range, which includes the conductive connector of the resin-coated bonding wire and the resin on the top surface of the semiconductor chip. Accordingly, product quality can be improved.

Third Exemplary Embodiment

A third exemplary embodiment of the invention illustrates a fabrication method of semiconductor chip stacks. The third exemplary embodiment is characterized by a re-wiring layer on the semiconductor IC surface. In the first and second exemplary embodiments, the pad connected to the conductive connectors is provided on the semiconductor IC surface, but may not be located on the edge of the semiconductor chip. In addition, there is a possibility that the position of the end of the conductive connector connected to the pad cannot be maintained at the height of the peak position 73 of the bent curve, as shown in FIG. 7, due to limitations in the position of the pad. It is intended to adjust the position of the end of the conductive connector by changing the position of the pad by providing the re-wiring layer on the semiconductor IC surface, and by relocating the position of the pad to a linear or zigzag position at the outermost circumferential position of the semiconductor chip.

FIG. 22 is a diagram illustrating a state where the re-wiring layer is formed on the semiconductor wafer.

FIG. 23 is a diagram illustrating a fabrication method of semiconductor chip stacks, which is characterized by forming a re-wiring layer on a semiconductor wafer. The fabrication method will be now described with reference to FIG. 22. A photolithography device is used to form the re-wiring layer. Re-wiring of a semiconductor wafer shown in FIG. 23 includes a) forming a plating seed layer (not shown) by sputtering a layer of, for example, Ti, W, or Au on the surface of the semiconductor wafer 51; b) laminating a photosensitive resist film 221; c) using a mask for re-wiring pattern in exposure and development; and d) forming a re-wiring layer 222 made of, for example, Au by electrolytic plating. In the electrolytic plating, pads 223 for connecting conductive connectors are simultaneously formed. The pads 223 are arranged in the linear or zigzag position, adjacent to the outermost position 224 of the semiconductor chips to be divided. After e) the seed layer is removed, f) a resin overcoat layer 225 is formed, thereby completely forming the re-wiring layer. The following steps of the fabrication method of semiconductor chip stacks are the same as "Step 1, Half Dicing" and the subsequent steps of the first exemplary embodiment as shown in FIG. 4 or "Step 1, Half Dicing" and the subsequent steps of the second exemplary embodiment as shown in FIG. 18. Thus, these descriptions thereof will be omitted herein.

Advantages of Third Exemplary Embodiment

The position of the pad to be connected to the conductive connectors can be adjusted using the semiconductor chips having the re-wiring layer. Thus, connection is carried out free from positional limitations, the height of the conductive connectors can be accurately set, and the ends of the conductive connectors can be accurately positioned. Accordingly, it is possible to ensure electrical characteristic of conductive connection.

Application of Third Exemplary Embodiment

The re-wiring layer formed on the semiconductor IC according to the third exemplary embodiment is applicable to the following: Pads are concentratively arranged on the side edge of the semiconductor chip, and conductive connectors are connected to corresponding pads. As a result, a plurality of semiconductor chips can be placed on the same plane and other semiconductor chips can be stacked on the plurality of semiconductor chips.

Figure 24:
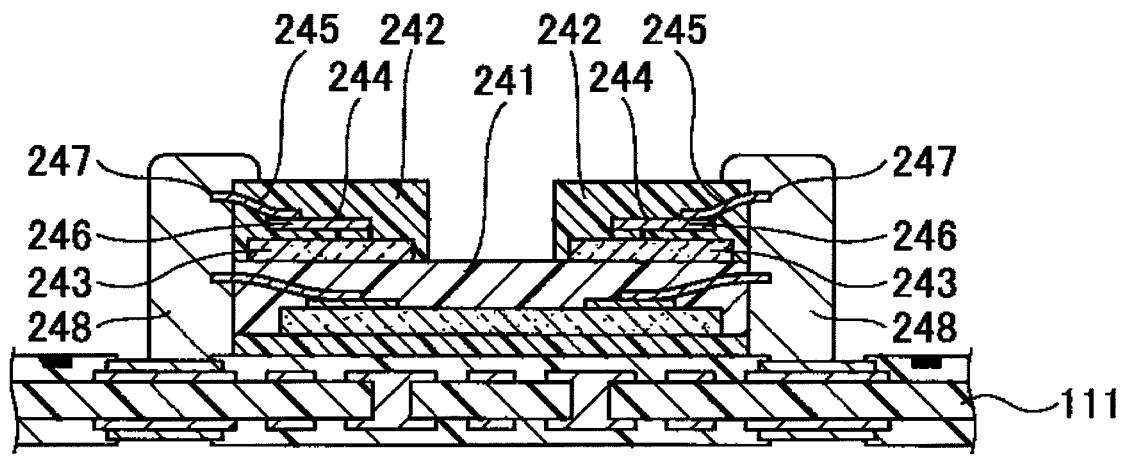
FIG. 24 is a diagram illustrating a plurality of semiconductor chips, which are arranged on the same plane, in accordance with an application of the third exemplary embodiment of the invention.

FIG. 24 is a diagram illustrating a plurality of semiconductor chips, which are arranged on the same plane, in accordance with an application of the third exemplary embodiment of the invention. Each of sealed chips 242 is placed on a lowermost sealed chip 241. Each of the sealed chips 242 has a re-wiring layer 244 on the surface of a semiconductor chip 243, and each conductive connector 245 is connected to a pad 246 arranged on the side edge of the sealed chip 242. Accordingly, electrical connection between an edge 247 of the conductive connector 245 and conductive members 248 can be easily obtained.

Advantages of Application of Third Exemplary Embodiment

Since a plurality of semiconductor chips having a re-wiring layer are placed on another semiconductor chip by arranging them on the same plane, a package having a function of a complex semiconductor can be provided.

Fourth Exemplary Embodiment

A fourth exemplary embodiment illustrates a semiconductor chip stack in which plural chips are stacked one on another in a step-like configuration.

Figure 25:
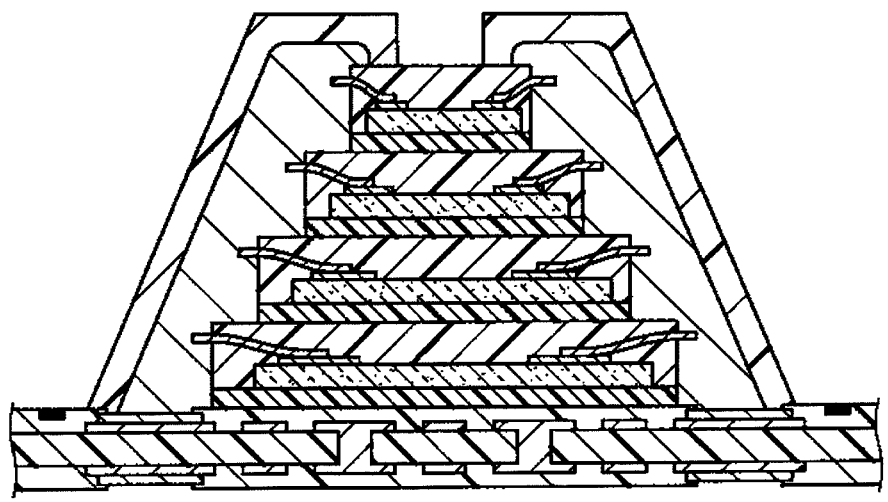
FIG. 25 is a diagram illustrating a semiconductor chip stack, which is characterized by stacking chips in a step-like configuration, in accordance with a fourth exemplary embodiment of the invention.

FIG. 25 is a diagram illustrating a semiconductor chip stack, in which plural chips are stacked in a step-like configuration, in accordance with the fourth exemplary embodiment of the invention. As shown in FIG. 25, according to this semiconductor chip stack, it is possible to stack different sizes of semiconductor chips or different types of semiconductor chips one on another.

Advantages of Fourth Exemplary Embodiment

With the step-like chip stack, it is possible to provide a package having the function as a complex semiconductor. For example, the complex semiconductor may be provided by stacking Central Processing Units (CPUs) of a logic circuit and semiconductor chips for memory.

Fifth Exemplary Embodiment

A fifth exemplary embodiment of the invention illustrates a semiconductor chip stack, in which a lowermost semiconductor chip of the chip stack is flip-chip mounted on a wiring substrate.

Figure 26:
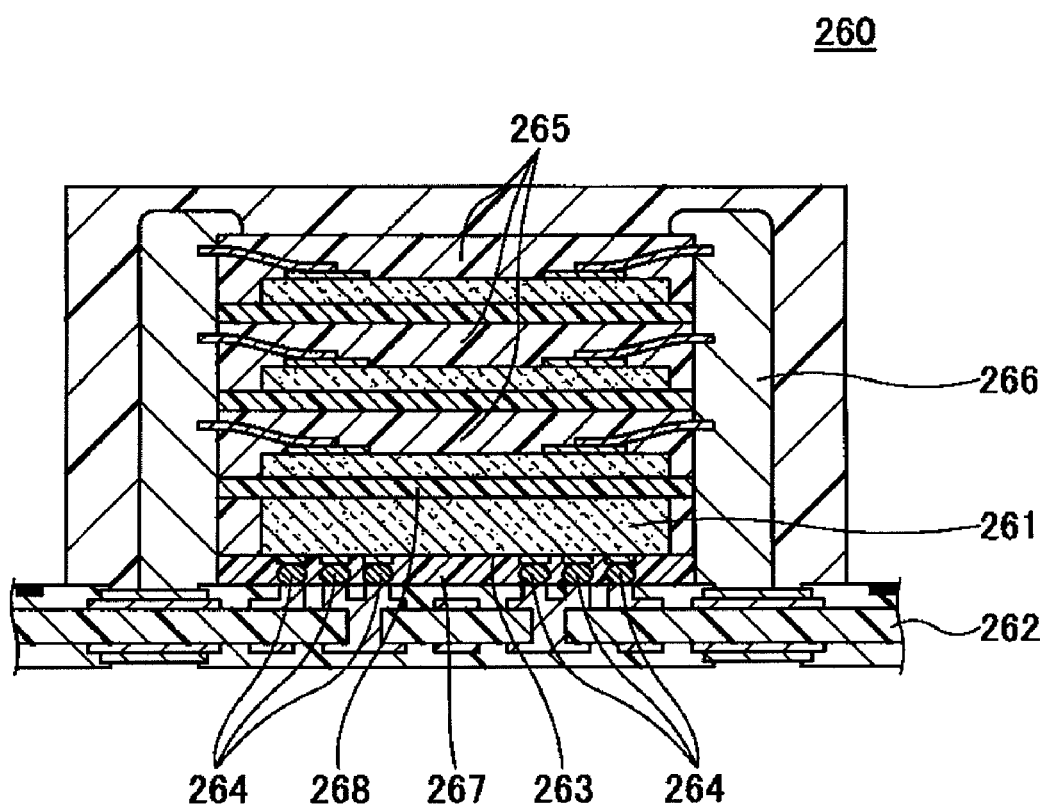
FIG. 26 is a diagram illustrating a semiconductor chip stack, in which a lowermost semiconductor chip of the chip stack is flip-chip mounted on a wiring substrate, in accordance with a fifth exemplary embodiment of the invention.

FIG. 26 is a diagram illustrating a semiconductor chip stack in accordance with the fifth exemplary embodiment of the invention. In the chip stack 260, a lowermost semiconductor chip 261 is flip-chip connected to a wiring substrate 262. The lowermost semiconductor chip 261 is flip-chip connected to the wiring substrate 262 through bumps 264. An IC surface 263 of the lowermost semiconductor chip 261 faces a surface of the wiring substrate 262 and other sealed chips 265 are electrically connected to each other and electrically connected to the wiring substrate 262 via conductive members 266. After the flip-chip connection of the semiconductor chip 261, a gap between the semiconductor chip 261 and the wiring substrate 262 is sealed with an under-filler 267. The DAF 268 is provided on the rear surface of the semiconductor chip 261, and another sealed chip is stacked on the semiconductor chip 261. The remaining steps (e.g., conductive connection and resin sealing of the chip stack) are the same as Steps 7 and 8 according to the first or second exemplary embodiment, and thus the description thereof will be omitted herein.

Advantages of Fifth Exemplary Embodiment

A package having the function as a complex semiconductor can be provided since the application range of semiconductor chips can be extended depending on the fabrication method of semiconductor packages. For example, the complex semiconductor may be provided by stacking logic circuit CPUs with multi-terminals or memory semiconductor chips one on another.

While the present invention has been shown and described with reference to certain exemplary embodiments thereof, it will be understood by those skilled in the art that various changes in form and details may be made therein without departing from the spirit and scope of the invention as defined by the appended claims. It is aimed, therefore, to cover in the appended claim all such changes and modifications as fall within the true spirit and scope of the present invention.

For example, the IC surfaces of chips to be stacked are not necessarily oriented in one direction. Rather, the direction of the IC surfaces can be selected according to the size of electronic appliances and limitations in the position of mounting substrates. In addition, the function of the electronic appliance can be additionally extended by applying, for example, the flip-chip mounting technology as described in the fifth exemplary embodiment.

What is claimed is:

1. A method of manufacturing a semiconductor device, the method comprising:
   (a) half-dicing a semiconductor wafer comprising a plurality of semiconductor chips, thereby forming dicing grooves in the semiconductor wafer, wherein each of the semiconductor chips includes a semiconductor integrated circuit and pads and wherein the semiconductor wafer includes: a first surface on which the semiconductor integrated circuit and the pads are formed; and a second surface opposite to the first surface,
   (b) connecting the pads to each other by conductive connectors;
   (c) sealing the first surface of the semiconductor wafer, the dicing grooves and the conductive connectors with a resin;
   (d) grinding the second surface of the semiconductor wafer, thereby forming a group of sealed chips, in which bodies of the semiconductor chips are separated from each other and are bonded by the resin;
   (e) dividing the group of sealed chips into individual sealed chips;
   (f) mounting and stacking the individual sealed chips on a wiring substrate having connection terminals thereon, thereby forming a semiconductor chip stack; and
   (g) electrically-connecting the conductive connectors and the connection terminals using a conductive member, wherein the conductive connectors are extended through side surfaces of each of the individual sealed chips.

2. The method according to claim 1, further comprising:
   (h) sealing the chip stack with a resin such that the conductive member is covered with the resin, after step (g).

3. The method according to claim 1, further comprising:
   (i) improving a conductivity of ends of the conductive connectors, before step (g).

4. The method according to claim 3, wherein step (i) comprises: exposing the ends of the conductive connectors from the semiconductor chip stack by plasma etching.

5. The method according to claim 3, wherein step (i) comprises: mounting solders on the ends of the conductive connectors.

6. The method according to claim 1, wherein step (c) comprises: coating a surface of the dicing grooves with the resin such that a space formed by the dicing grooves is not filled with the resin.

7. The method according to claim 1, wherein the conductive member is made of a conductive paste or a solder.

8. A semiconductor device comprising:
- a wiring substrate having connection terminals thereon;
- a semiconductor chip stack comprising a plurality of semiconductor chips which are stacked on top of each other, the semiconductor chip stack being mounted on the wiring substrate, wherein each of the semiconductor chips comprises:
  - a semiconductor integrated circuit that is formed on a top surface of the semiconductor chip;
  - a pad that is formed on the top surface of the semiconductor chip;
  - a conductive connector connected to the pad and extending beyond a side surface of the semiconductor chip, the conductive connector formed as a bonding wire; and
  - a first sealing resin that seals the semiconductor integrated circuit, the pad and the conductive connector and covers a side surface of the semiconductor chip such that an end portion of the conductive connector is exposed from the first sealing resin, and
- a conductive member formed on the first sealing resin and covering each of the end portions of the conductive connectors so as to electrically connect each of the end portions of the conductive connectors to the connection terminals; and
- a second sealing resin that seals the semiconductor chip stack, the conductive member and a surface of the wiring substrate.

9. The semiconductor device according to claim 8, wherein the semiconductor chip stack is flip-chip mounted on the wiring substrate.

10. The semiconductor device according to claim 8, wherein the conductive connector is protruded from the first sealing resin.

11. The semiconductor device according to claim 8, further comprising:
- solders formed on each of the end portions of the conductive connectors.

* * * * *